United States Patent
Song et al.

(10) Patent No.: US 9,311,257 B2
(45) Date of Patent: Apr. 12, 2016

(54) SEMICONDUCTOR MEMORY DEVICE, MEMORY SYSTEM AND METHOD OF OPERATING THE SAME

(71) Applicant: SK hynix Inc., Icheon-si Gyeonggi-do (KR)

(72) Inventors: Sang Hyun Song, Bucheon-si (KR); Won Sun Park, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 218 days.

(21) Appl. No.: 14/255,441

(22) Filed: Apr. 17, 2014

(65) Prior Publication Data
US 2015/0127914 A1    May 7, 2015

(30) Foreign Application Priority Data
Nov. 1, 2013    (KR) .................. 10-2013-0132089

(51) Int. Cl.
*G06F 12/00*    (2006.01)
*G06F 13/16*    (2006.01)

(52) U.S. Cl.
CPC ........ *G06F 13/1663* (2013.01); *G06F 13/1657* (2013.01); *G06F 13/1668* (2013.01); *G06F 13/1689* (2013.01); *G11C 2216/22* (2013.01); *G11C 2216/24* (2013.01)

(58) Field of Classification Search
CPC ............ G06F 13/1657; G06F 13/1663; G06F 13/1668; G06F 13/1689; G06F 12/0246; G11C 2216/22; G11C 2216/24
See application file for complete search history.

(56) References Cited

U.S. PATENT DOCUMENTS

| | | | |
|---|---|---|---|
| 8,132,045 B2* | 3/2012 | Avila .................... | G06F 11/141 711/103 |
| 2007/0091680 A1* | 4/2007 | Conley ................... | G11C 16/10 365/185.11 |
| 2007/0130416 A1* | 6/2007 | Yada ..................... | G06F 3/0605 711/103 |
| 2011/0087950 A1* | 4/2011 | Yu ....................... | G06F 11/1072 714/773 |
| 2014/0153352 A1* | 6/2014 | Sato ..................... | G11C 5/02 365/230.03 |

FOREIGN PATENT DOCUMENTS

| KR | 1020050020188 A | 3/2005 |
|---|---|---|
| KR | 1020090124102 A | 12/2009 |

* cited by examiner

*Primary Examiner* — John Lane
(74) *Attorney, Agent, or Firm* — William Park & Associates Ltd.

(57) ABSTRACT

A memory system including a plurality of memory chips is provided. The memory system includes a first memory chip and a second memory chip that share a data bus and become active by a chip enable signal, and a controller transmitting multi chip select commands to the first and second memory chips. The first memory chip, in response to the first multichip select command, receives a first operation request transmitted by the controller through the data base, and the second memory chip, in response to the second multichip select command, receives a second operation request transmitted by the controller through the data bus before the first memory chip operates according to the first operation request.

19 Claims, 6 Drawing Sheets

SEMICONDUCTOR MEMORY DEVICE, MEMORY SYSTEM AND METHOD OF OPERATING THE SAME

CROSS-REFERENCE TO RELATED APPLICATION

The present application claims priority under 35 U.S.C 119(a) to Korean Patent Application No. 10-2013-0132089, filed on Nov. 1, 2013, in the Korean Intellectual Property Office, which is incorporated herein by reference in its entirety as set forth in full.

BACKGROUND

1. Field of the Invention

The invention generally relates to a memory chip, a memory system and a method of operating the same. More specifically, the present invention relates to a memory system including a plurality of memory chips and a method of operating the same.

2. Discussion of Related Art

A non-volatile memory device is a device that can electrically erase and program data, and retain data even when power is turned off. A non-volatile memory device includes a flash memory chip and an adjustable resistant memory device. In general, flash memory chips are classified as NOR flash memories and NAND flash memories. NOR flash memories are provided with a structure having memory cells each independently connected to a bit line and a word line. Accordingly, NOR flash memories have superior random access time.

A NAND flash memory has a plurality of memory cells connected in series. Such a structure is referred to as a cell string structure, and a single bit line contact is required for each cell string. Accordingly, NAND flash memories are superior in terms of the degree of integration. Due to the superior degree of integration, NAND flash memories are used as data storage devices in various equipment, such as MP3 Players, various memory cards and Solid State Drivers (SSDs).

In order to increase a data storage capacity, a memory system uses a plurality of memory chips. In such a multichip memory system, a plurality of memory chips are connected to a memory controller while sharing a data bus.

SUMMARY

One aspect of the present disclosure provides a memory system including: a first memory chip configured to become active in response to a chip enable signal; a second memory chip configured to become active in response to the chip enable signal and configured to share a data bus with the first memory chip; and a controller connected to the first memory chip and the second memory chip in common through the data bus and configured to transmit a first multichip select command and a second multichip select command through the data bus, wherein the first memory chip, in response to the first multichip select command receives a first operation request transmitted by the controller through the data bus; and wherein the second memory chip, in response to the second multichip select command, receives a second operation request transmitted by the controller through the data bus before the first memory chip operates according to the first operation request.

Other aspects of the present disclosure provide for a method of operating a memory system having a plurality of memory chips including a first memory chip and a second memory chip and a controller, the method including: allowing the plurality of memory chips to become active by transmitting a chip enable signal; transmitting a first multichip select command to the first memory chip from the controller; transmitting a first operation request to the first memory chip in response to the first multichip select command; transmitting a second multichip select command to the second memory chip from the controller; transmitting a second operation request to the second memory chip in response to the second multichip select command; transmitting an operation confirm signal to the first and second memory chips from the controller; and performing operations according to the first and second operation requests in response to the operation confirm signal.

Other aspects of the present disclosure provide for a method of operating a semiconductor memory device, the method including: receiving a multichip select command; receiving an operation request in response to the multichip select command; receiving an operation confirm signal instructing to perform an operation according to the operation request; and performing the operation according to the operation request in response to the operation confirm signal.

Other aspects of the present disclosure provide for a computing system including: a memory system; a bus electrically coupled with the memory system, the memory system including: a first memory chip configured to become active in response to a chip enable signal; a second memory chip configured to become active in response to the chip enable signal and configured to share the data bus with the first memory chip; and a controller connected to the first memory chip and the second memory chip in common through the data bus and configured to transmit a first multichip select command and a second multichip select command through the data bus, wherein the first memory chip, in response to the first multichip select command, receives a first operation request transmitted by the controller through the data bus; and wherein the second memory chip, in response to the second multichip select command, receives a second operation request transmitted by the controller through the data bus before the first memory chip operates according to the first operation request.

BRIEF DESCRIPTION OF THE DRAWINGS

The above and other features and advantages of the present disclosure will become more apparent to those of ordinary skill in the art by describing in detail various examples of embodiments thereof with reference to the attached drawings in which.

DETAILED DESCRIPTION

The present disclosure will be described more fully hereinafter with reference to the accompanying drawings, in which various examples of the embodiments of the invention are shown. The embodiments may, however, be embodied in different forms and should not be construed as limited to the embodiments set forth herein.

In the description of the present disclosure, it will be understood that, when a part is referred to as being "connected" to another part, it can be "directly connected" to the other part or "indirectly connected" to the other part while intervening one or more elements therebetween. In the description of the present disclosure, it will be understood that, when a part includes/comprises an element, another element is not excluded but further included as long as an opposite statement is not made.

Figure 1:
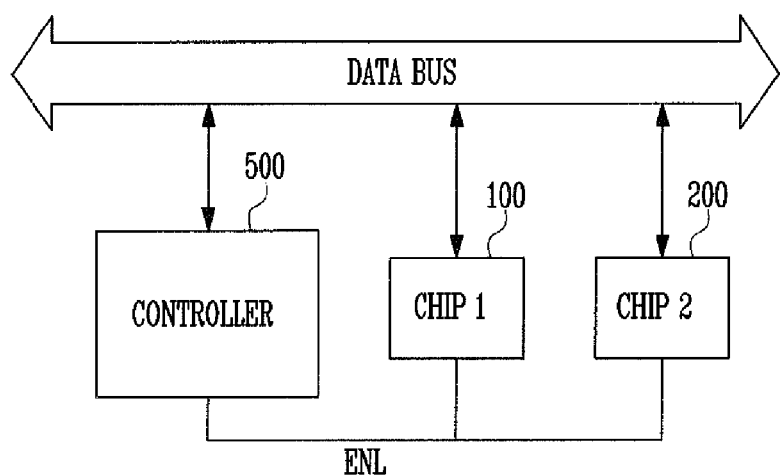
FIG. 1 is a block diagram illustrating a memory system according to an embodiment of the present disclosure.

FIG. 1 is a block diagram illustrating a memory system 10 according to an embodiment of the present disclosure.

Referring FIG. 1, the memory system 10 includes a first memory chip 100, a second memory chip 200 and a controller 500. The first and second memory chips according to an embodiment of the present disclosure may be implemented as NAND flash memories. However, it will be understood that the first and second memory chips are not limited to the NAND flash memories. For example, the first and second memory chips may be implemented as one type of non-volatile memory device, such as a NOR flash memory, a phase-change RAM (PRAM), a ferroelectric RAM (FRAM) and a magnetic RAM (MRAM). In the present specification, the memory device represents a memory chip included in plural number in a multichip memory system. That is, the memory device may represent a single memory chip, and the multichip memory system may represent a memory system including a plurality of memory devices.

The first memory chip 100 becomes active by a chip enable signal. The chip enable signal may be provided by an enable line ENL. The first memory chip 100 may become active in response to the chip enable signal provided through the enable line ELL. The detailed operation of the first memory chip 100 may be conducted after the first memory chip 100 becomes active. The chip enable signal may be provided from the controller 500.

Although not shown in FIG. 1, the first memory chip is a single memory device and may include a memory core, an interface unit and a control unit. The memory core may include a memory cell to store data and a read/write circuit to perform a read/write operation on the memory cell. The interface unit may determine a control signal input from the controller 500 and provide the determined control signal to the control unit. The control unit may generate a control signal or voltage according to the provided result of determination so as to control each component of the first memory chip, for example, a memory core.

As will be described later, the first memory chip may be implemented as a non-volatile memory device including a plurality of planes. The planes may include a plurality of memory cell blocks each serving as a unit of memory cell arrays. Each of the planes may include page buffers that operate independently from one another. According to an embodiment, the plurality of planes become sequentially active to perform data input/output operations.

The second memory chip 200 becomes active by a chip enable signal. Similar to the first memory chip 100, the chip enable signal may be provided to the second memory chip 200 by an enable line ENL. The detailed operation of the second memory chip 200 may be conducted after the second memory chip 200 becomes active. As shown in FIG. 1, according to an embodiment, the first memory chip 100 and the second memory chip 200 share a data bus. The data bus may transmit information to be input into memory cells of the first and second memory chips, and address information of a memory cell at which a detailed operation is to be performed.

The controller 500 is connected in common to the first memory chip 100 and the second memory chip 200 through the data bus. The controller 500 controls the first memory chip 100 and the second memory chip 200. For example, the controller 500 may control the first memory chip 100 and the second memory chip 200 to perform a command requested by a host system (for example, an operation of programming or reading data). In order to control the first memory chip 100 and the second memory chip 200, firmware may be installed on the controller 500. Although not shown, the controller 500 may include a storage device to store firmware and a host interface for interfacing with a host.

The controller 500 may generate a chip enable signal and transmit the chip enable signal to the first and second memory chips 100 and 200 through an enable line ENL. The first and second memory chips 100 and 200 may become active by the chip enable signal. The first and second memory chips 100 and 200 may perform a program operation or a read operation after becoming active by the chip enable signal. When the first and second memory chips 100 and 200 are connected by a single enable line ENL, the first and second memory chips 100 and 200 may simultaneously become active by the chip enable signal transmitted from the controller 500. In addition, the controller 500 may transmit data and an address to the first memory chip 100 and the second memory chip 200 through the data bus.

In the memory system 10 according to the present disclosure, in order to perform a multichip operation, the controller 500 may transmit first and second multichip select commands through the data bus. Each of the first and second multichip select commands may include information about a chip number of a chip that performs a multichip operation. For example, when the first multichip select command is a command related to an operation of the first memory chip 100, the first memory chip 100 may perform an initialization process for a multichip operation by receiving the first multichip select command. Meanwhile, the second memory chip 200 may ignore any first multichip select command that it receives. Similarly, when the second multichip select command is a command related to an operation of the second memory chip 200, the first memory chip 100 may ignore any second multichip select command that it receives. In this case, the second memory chip 200 may perform an initialization process for a multichip operation by receiving the second multichip select command.

The detailed operation of the memory system 10 according to an embodiment of the present disclosure will be described in detail with reference to FIGS. 2 to 4.

Figure 2:
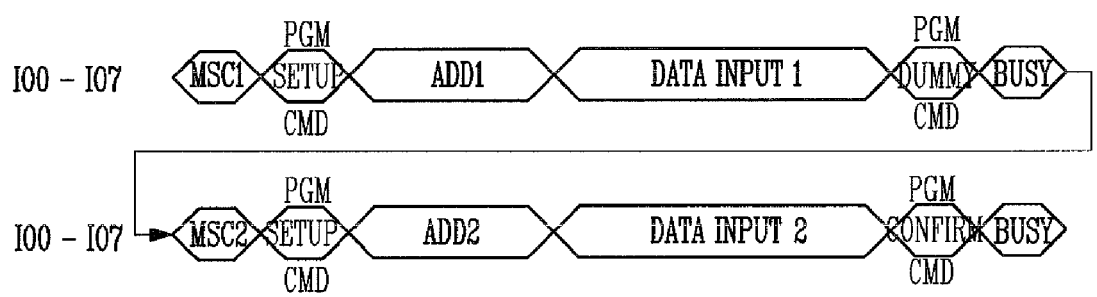
FIG. 2 is a timing chart showing a program operation method of the memory system according to an embodiment of the present disclosure.

FIG. 2 is a timing chart showing a program operation method of the memory system 10 according to an embodiment of the present disclosure. For the sake of convenience of the description, the following description of the memory system 10 will be made in relation to a case in which the first memory chip 100 first receives a first multichip select command, and then the second memory chip 200 receives a second multichip select command. However, depending on the operation of the memory system 10, the second memory chip 200 may first receive a multichip select command, and then the first memory chip 100 may receive a multichip select command and operate.

Referring to FIG. 2, data is input to eight pins including IO0 to IO7. The eight pins including IO0 to IO7 may be connected to the data bus. First, a first multichip select command MSC1 is transmitted through the data bus. Since the first multichip select command MSC1 involves an operation of the first memory chip 100, the first memory chip 100 may prepare for an operation by receiving the first multichip select command MSC1. Meanwhile, the second memory chip 200 may ignore the first multichip select command MSC1.

After the first multichip select command MSC1 is transmitted, a program setup command PGM SETUP CMD may be transmitted. As the program setup command PGM SETUP CMD is transmitted, the first memory chip 100, having received the first multichip select command MSC1, may prepare for a program operation. After the program setup command PGM SETUP CMD is transmitted, an address ADD1 of a cell of the first memory chip 100 to be programmed is transmitted, and a data input DATA INPUT 1 to be programmed is transmitted. According to the present specification, a first operation request to the first memory chip 100 may include the address ADD1 and the data input DATA INPUT 1. That is, the first operation request may include information about an address of a cell of the first memory chip 100 that is to operate and information about data. The address ADD1 and the program data input DATA INPUT 1 may be stored in a temporary storage device, such as a register or page buffer in the first memory chip 100 before an actual program operation is performed.

After the address ADD1 and the data input DATA INPUT 1 are transmitted to the first memory chip 100 and temporarily stored, a program dummy command PGM DUMMY CMD is transmitted and the first memory chip 100 enters a BUSY state. The program dummy command PGM DUMMY CMD is transmitted so that the first memory chip 100 does not perform a program operation in practice and waits in this stage. A program operation of the first memory chip 100 may be performed together with a program operation of the second memory chip 200. According to other embodiments, the program dummy command PGM DUMMY CMD may be omitted.

After the first operation request including the address ADD1 and the data input DATA INPUT1 is transmitted to the first memory chip 100, a second multichip select command MSC2 may be transmitted to the second memory chip 200. Since the second multichip select command MSC2 involves an operation of the second memory chip 200, the first memory chip 100 may ignore the second multichip select command MSC2. Meanwhile, the second memory chip 200 may prepare for an operation by receiving the second multichip select command MSC2.

After the second multichip select command MSC2 is transmitted, a program setup command PGM SETUP CMD may be transmitted. As the program setup command PGM SETUP CMD is transmitted, the second memory chip 200, having received the second multichip select command MSC2, may prepare for a program operation. After the program setup command PGM SETUP CMD is transmitted, an address ADD2 of a cell of the second memory chip 200 to be programmed is transmitted, and a data input DATA INPUT 2 to be programmed is transmitted. Similar to the first operation request, the second operation request to the second memory chip 200 may include the address ADD2 and the data input DATA INPUT 2. That is, the second operation request may include information about an address of a cell of the second memory chip 200 that is to operate and information about data. The address ADD2 and the program data input DATA INPUT 2 may be stored in a temporary storage device, such as a register or page buffer in the second memory chip 200, before an actual program operation is performed.

After the first operation request and the second operation request are transmitted to the first memory chip 100 and the second memory chip 200, the controller 500 may transmit an operation confirm signal PGM CONFIRM CMD. In this case, since the multichip operation is a program operation, the operation confirm signal PGM CONFIRM CMD may be a program operation confirm signal. The first memory chip 100 and the second memory chip 200 may simultaneously perform actual program operations based on the data stored in each of the respective temporary storage devices in response to the operation confirm signal PGM CONFIRM CMD. That is, the first memory chip 100 programs the data input DATA INPUT 1 in the address ADD1 in response to the operation confirm signal PGM CONFIRM CMD, and the second memory chip 200, also in response to the operation confirm signal PGM CONFIRM CMD, may program the data input DATA INPUT 2 in the address ADD2. According to the memory system 10 according to an embodiment of the present disclosure, the data inputs DATA INPUT 1 and DATA INPUT 2 with respect to the addresses ADD1 and ADD2 of the first memory chip 100 and the second memory chip 200 are simultaneously programmed, so that the operation speed of the memory system 10 may be improved. That is, according to the memory system 10 of an embodiment of the present disclosure, the first memory chip 100 receives the first operation request and the second memory chip 200 receives the second operation request, and an operation confirm signal is transmitted to the first memory chip 100 and the second memory chip 200 such that actual operations are simultaneously performed, thereby improving the operating speed of the memory system 10.

Although the memory system 10 according to an embodiment of the present disclosure has been described above in relation to a multichip operation corresponding to a program operation, the present disclosure is not limited thereto. The memory system 10 according to an embodiment of the present disclosure may operate with respect to operations other than a program operation, for example, a data read operation and an erase operation, in the same manner as above. The read operation of the memory system 10 according to an embodiment of the present disclosure will be described with reference to FIG. 8 later. In addition, although the above multichip operation of FIG. 2 has been illustrated in relation to the two memory chips 100 and 200, a memory system including two or more memory chips may also perform a multichip operation in the same manner as above. For example, a multichip operation of a memory system including four memory chips will be described with reference to FIGS. 6 and 7 later.

Figure 3:
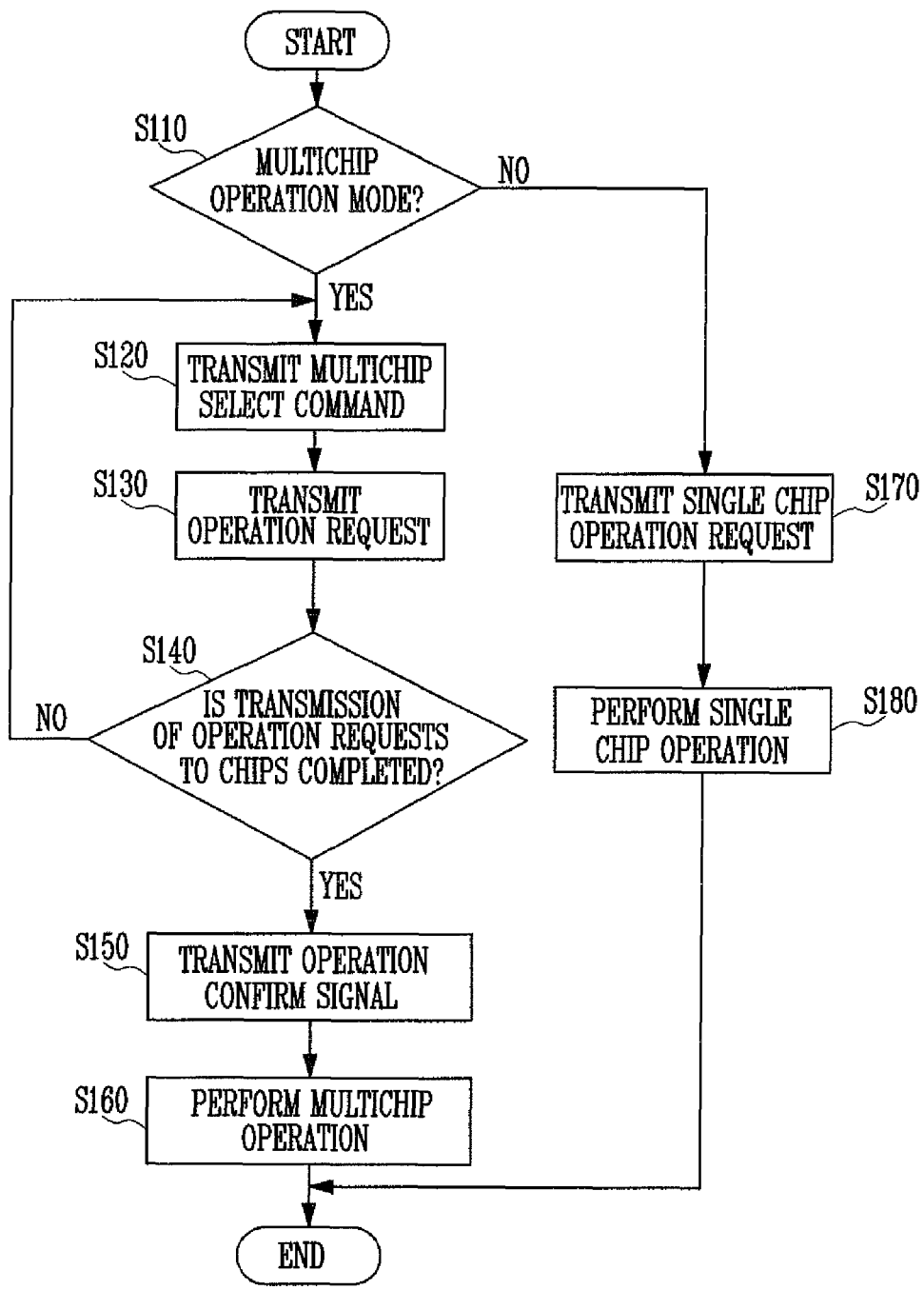
FIG. 3 is a flowchart showing a method of operating the memory system according to an embodiment of the present disclosure.

FIG. 3 is a flowchart showing a method of operating a memory system according to an embodiment of the present disclosure.

Referring to FIG. 3, the memory system 10 determines whether a current operation mode is a multichip operation mode (S110). For example, when the controller 500 of the memory system 10 generates and transmits a multichip select command, the memory system 10 operates in a multichip operation mode. When the controller 500 of the memory system 10 transmits an operation setup command, for example, a program setup command, without transmitting a multichip select command, the memory system 10 may operate in a single chip operation mode.

When the memory system 10 operates in a multichip operation mode, the controller 500 transmits a multichip select command to a memory chip that is to perform an operation first (S120). Subsequently, an operation request is transmitted to the memory chip selected by the multichip select command (S130). As described above, the operation request may include an address and data related to a detailed operation of the selected memory chip. For example, in a case when the memory system 10 performs a program operation in the multichip operation mode, the operation request may include an address of a memory cell to be programmed and program data. When the memory system 10 performs a read operation in the multichip operation mode, the operation request may include an address of a memory cell from which data is desired to be read.

After the operation request is transmitted to the memory chip, it is determined whether operation requests are transmitted to all memory chips that are to perform a multichip operation (S140). The determination may be made by the controller 500 of the memory system 10. If it is determined that transmission of the operation requests to all the memory chips performing the multichip operation is not completed, the controller 500 additionally transmits operation requests to other memory chips, and if it is determined that transmission of the operation requests to all the memory chips performing the multichip operation is completed, the controller 500 transmits an operation confirm signal for an actual operation of the corresponding memory chips.

That is, if it is determined in operation S140 that transmission of operation requests to the corresponding memory chips is not completed, the control operation returns to operation S120 to additionally transmit multichip select commands for other memory chips. Accordingly, operation requests for the other memory chips are transmitted. If it is determined in operation S140 that transmission of operation requests to the corresponding memory chips is completed, an operation confirm signal is transmitted (S150). In response to the reception of the operation confirm signal, all the memory chips having received the operation requests perform a multichip operation by performing respective operations (S160).

If it is determined in operation S110 that the current operation mode of the memory system 10 is not a multichip operation mode, the memory system 10 performs a conventional operation. An operation request for a signal chip is transmitted to the corresponding memory chip (S170). The memory chip having received the operation request performs a single chip operation (S180). An operation method of a memory system including a plurality of memory chips has been shown with reference to FIG. 3. An operation method of an individual memory chip included in the memory system will be described with reference to FIG. 4 below.

Figure 4:
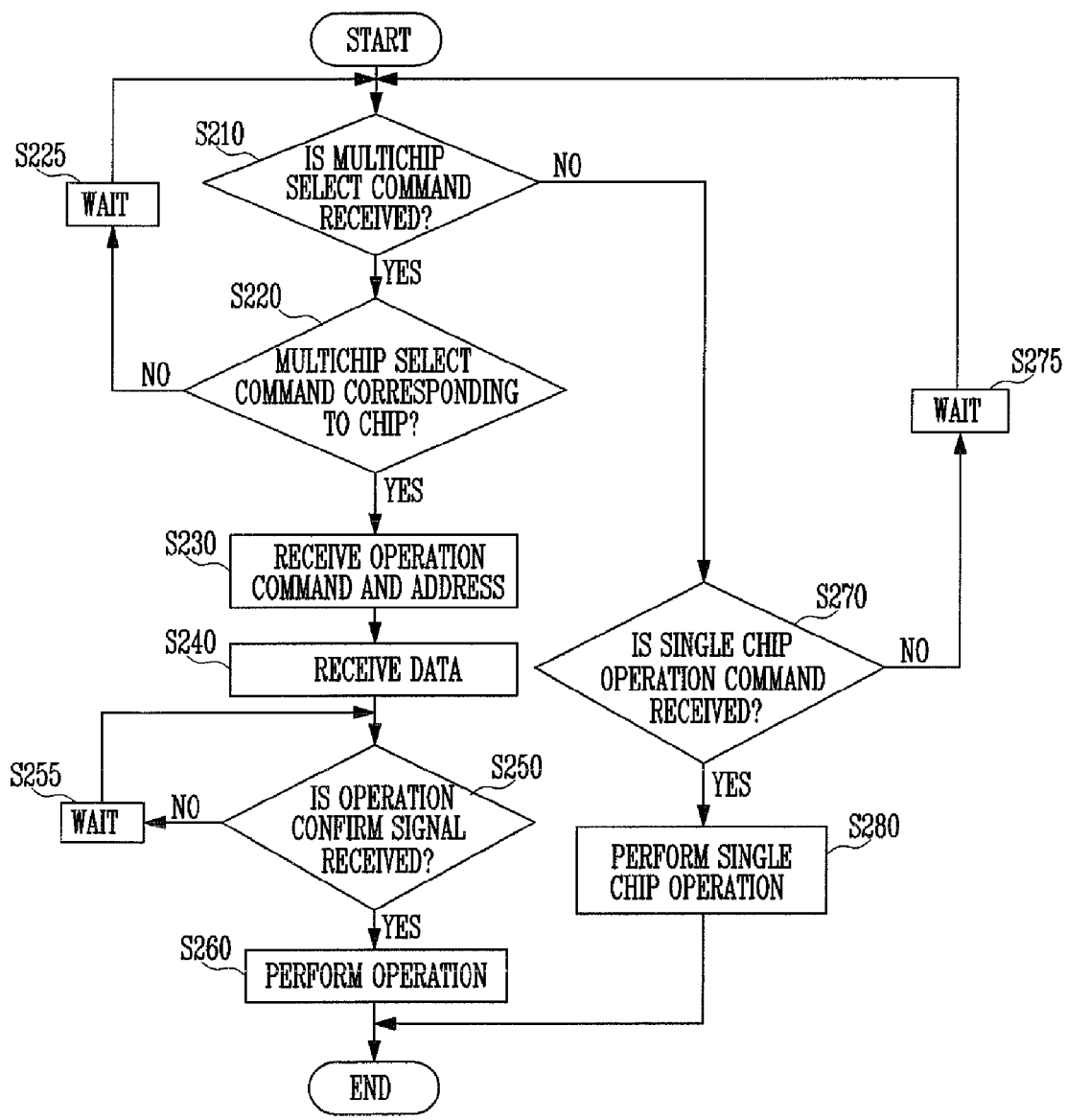
FIG. 4 is a flowchart showing a method of operating a semiconductor memory device according to an embodiment of the present disclosure.

FIG. 4 is a flowchart showing a method of operating a semiconductor memory device according to an embodiment of the present disclosure.

Referring to FIG. 4, it is determined whether a multichip select command is received by one of a plurality of semiconductor memory devices included in a memory system, that is, by one memory chip (S210). If the multichip select command is not received, it is determined whether a single chip operation command is received (S270). If the single chip operation command is not received, the memory chip enters a waiting state (S275). If it is determined in operation S270 that the single chip operation is received, the memory chip performs a single chip operation.

If it is determined in operation S210 that the multichip select command is received, the memory chip determines whether the multichip select command is a multichip select command corresponding to the memory chip. If the multichip select command is not a multichip select command corresponding to the memory chip, the memory chip ignores subsequent operation commands and operation requests, and enters a waiting state (S225). If the multichip select command is a multichip select command corresponding to the memory chip, the memory chip receives an operation command and an address (S230). The operation command may be one of a program command, a read command and an erase command. For convenience of description, a program command is illustrated as an example of the operation command in FIG. 4. When the multichip operation is a program operation, data to be programmed to a memory cell of the memory chip needs to be received. In FIG. 4, data to be programmed is received (S240). When the multichip operation is a read operation or an erase operation for which data need not be received, operation S240 may be omitted. In this case, the operation request may only include an address as described above.

Accordingly, the memory chip receives data in operation S240. As described above, the address and data may be stored in a temporary storage device, for example, a register or a page buffer, in the memory chip. When the address and data are stored in the temporary storage device, the memory chip waits for reception of an operation confirm signal.

After an operation request including an address and data is received in operations S230 and S240, it is determined whether an operation confirm signal is received by the memory chip (S250). When an operation request needs to be received by other memory chips, the operation confirm signal is not received by the memory chip. In this case, the memory chip enters a waiting state (S255). When operation requests are received by all other memory chips performing a multichip operation, the operation confirm signal is received. In this case, the memory chip performs a respective operation in response to the operation confirm signal (S260).

According to the present embodiment of the present disclosure, after sequentially receiving operation requests (program operation requests in FIG. 4) in operations S210 to S240, the plurality of memory chips simultaneously perform program operations in response to the operation requests in operation S250 so that the operation speed of the memory system may be improved.

Figure 5:
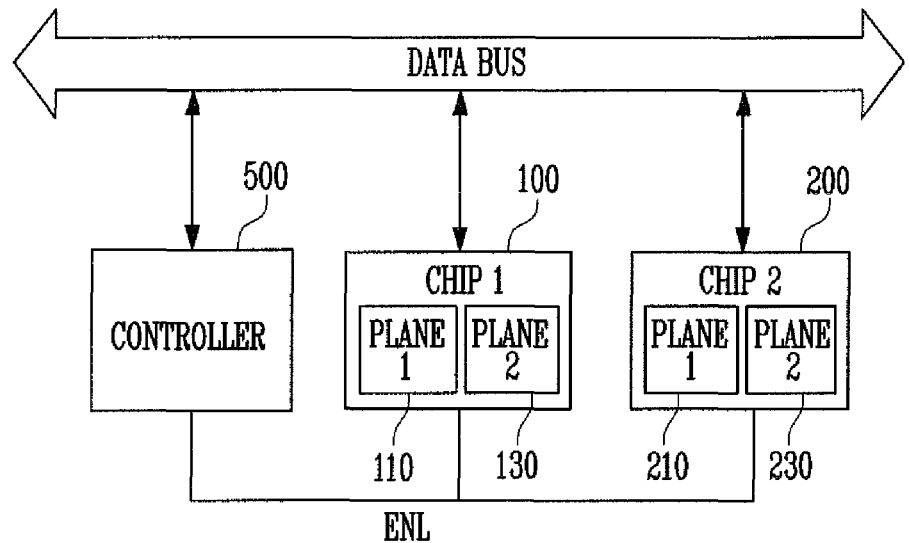
FIG. 5 is a detailed view illustrating the memory system according to an embodiment of the present disclosure.

FIG. 5 is a detailed view illustrating the memory system according to an embodiment of the present disclosure. In FIG. 5, the operation of the memory system 10 when the first memory chip 100 and the second memory chip 200 of the memory system 10 include a plurality of planes 110 and 130 and a plurality of planes 210 and 230, respectively, is described. The first memory chip 100 and the second memory chip 200 of the memory system 10 include a plurality of planes 110 and 130 and a plurality of planes 210 and 230, respectively. As described above, each of the plurality of planes 110, 130, 210 and 230 may include page buffers that independently operate.

The memory system according to an embodiment of the present disclosure may perform a multi-plane operation with respect to a plurality of memory chips each including a plurality of planes. The multi-plane operation may be performed with respect to a case in which a plurality of planes to be operated are included in the same chip or a case in which a plurality of planes to be operated are included in different chips.

For example, when a multi-plane operation needs to be performed with respect to the first plane 110 of the first memory chip 100 and the first plane 210 of the second memory chip 200, the multi-plane operation is achieved by performing the multichip operation as described in FIGS. 1 to 4. When a multi-plane operation needs to be performed with respect to the first plane 110 and the second plane 130 of the first memory chip 100, a single chip multi plane operation may be performed. As described above, since each of the plurality of planes included in a single chip includes page buffers that are independently operated, operation requests for the first plane 110 and the second plane 130 of the first memory chip 100 may be independently transmitted to the page buffers of the first plane 110 and the second plane 130, respectively, and actual operations, for example, program operations, may be simultaneously performed in the first and second planes 110 and 130. Accordingly, regardless of whether or not there are a plurality of planes performing a multi-plane operation in the same memory, the multi-plane operation may be easily performed, so that the operating speed of the memory system is improved.

Figure 6:
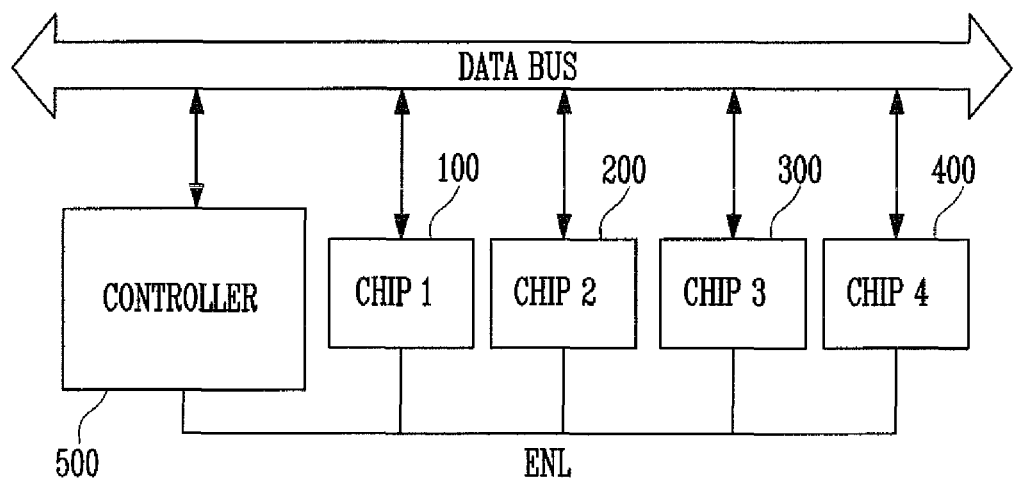
FIG. 6 is a block diagram illustrating a memory system according to an embodiment of the present disclosure.

FIG. 6 is a block diagram illustrating a memory system 20 according to other embodiments of the present disclosure.

Referring to FIG. 6, the memory system 20 including a first memory chip 100, a second memory chip 200, a third memory chip 300 and a fourth memory chip 400 is shown. Although FIGS. 1 to 5 illustrate the memory system 10 having only two memory chips, the present disclosure is not limited thereto. As shown in the memory system of FIG. 6 according to other embodiments of the present disclosure, the number of memory chips included in the present disclosure may vary with embodiments.

The memory system 20 includes the first memory chip 100, the second memory chip 200, the third memory chip 300, the fourth memory chip 400 and the controller 500. Each of the first to fourth memory chips 100 to 400 is implemented as a NAND flash memory, and according to other embodiments, may be implemented as one type of non-volatile memory device, such as a NOR flash memory, a PRAM, a FRAM and a MRAM.

The first to fourth memory chips 100, 200, 300 and 400 become active by a chip enable signal, and the chip enable signal may be provided by an enable line ENL from the controller 500. Since the first to fourth memory chips 100 to 400 share the enable line ENL, the first to fourth memory chips 100 to 400 may become simultaneously active by the chip enable signal provided from the controller 500. In addition, the first to fourth memory chips 100 to 400 may share a data bus DATA BUS, and the controller 500 may transmit data and addresses to the first to fourth memory chips 100 to 400 through the data bus.

Figure 7:
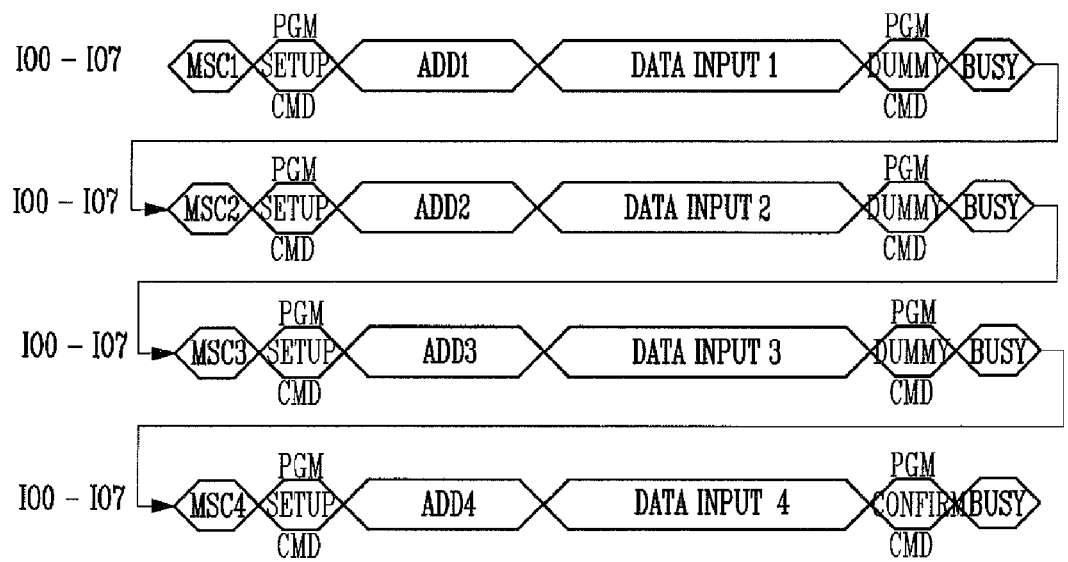
FIG. 7 is a timing chart showing a program operation method of the memory system according to an embodiment of the present disclosure.

FIG. 7 is a timing chart showing a program operation method of the memory system 20 according to other embodiments of the present disclosure. Hereinafter, for convenience of description, the following description will be made in relation to an operation of the memory system 20 in which the first to fourth memory chips 100, 200, 300 and 400 sequentially receive first to fourth multichip select commands. However, the order in which the memory chips receive multichip select commands may be changed.

Referring to FIG. 7, data is input to eight pins including IO0 to IO7. The eight pins including IO0 to IO7 may be connected to a data bus. First, a first multichip select command MSC1 is transmitted through the data bus. Since the first multichip select command MSC1 involves an operation of the first memory chip 100, the first memory chip 100 may prepare for an operation by receiving the first multichip select command MSC1. Meanwhile, the second to fourth memory chips 200 to 400 may ignore the first multichip select command MSC1.

After the first multichip select command MSC1 is transmitted, a program setup command PGM SETUP CMD may be transmitted. As the program setup command PGM SETUP CMD is transmitted, the first memory chip 100, having received the first multichip select command MSC1, may prepare for a program operation. After the program setup command PGM SETUP CMD is transmitted, an address ADD1 of a cell of the first memory chip 100 to be programmed is transmitted, and a data input DATA INPUT 1 to be programmed is transmitted. According to the present specification, with a program operation, a first operation request to the first memory chip 100 may include the address ADD1 and the data input DATA INPUT 1. That is, the first operation request may include information about an address of a cell of the first memory chip 100 that is to operate and information about data. The address ADD1 and the program data input DATA INPUT 1 may be stored in a temporary storage device, such as a register or a page buffer in the first memory chip 100 before an actual program operation is performed.

After the address ADD1 and the data input DATA INPUT 1 are transmitted to the first memory chip 100 and temporarily stored, a program dummy command PGM DUMMY CMD is transmitted and the first memory chip 100 enters a BUSY state. In this stage, the first memory chip 100 does not perform a program in practice and waits, and a program operation of the first memory chip 100 may be performed together with program operations of the second to fourth memory chips 200 to 400. According to other embodiments, the program dummy command PGM DUMMY CMD may be omitted.

After the first operation request including the address ADD1 and the data input DATA INPUT1 is transmitted to the first memory chip 100, a second multichip select command MSC2 may be transmitted to the second memory chip 200. Since the second multichip select command MSC2 involves an operation of the second memory chip 200, the first memory chip 100, the third memory chip 300 and the fourth memory chip 400 may ignore the second multichip select command MSC2. Meanwhile, the second memory chip 200 may prepare for an operation by receiving the second multichip select command MSC2 and a program setup command PGM SETUP CMD. Similar to the first memory chip 100, the second memory chip 200 receives an address ADD2 and a data input DATA INPUT2, and temporarily stores the received address ADD2 and data input DATA INPUT2 and waits. This process is applied to the third memory chip 300 in the same manner.

The fourth memory chip 400 receives a fourth multichip select command MSC4 and a program setup command PGM SETUP CMD, receives a fourth operation request including an address ADD4 and a data input DATA INPUT4, and an operation confirm signal PGM CONFIRM CMD is transmitted. The first to fourth memory chips 100 to 400 perform actual program operations with respect to memory cells in response to the received operation confirm signal PGM CONFIRM CMD.

Although FIG. 7 shows a timing chart corresponding to a multichip operation performed with respect to all of the four memory chips, it will be understood that two or three memory chips may be subject to a multichip operation even if four memory chips are included in a memory system. For example, a multichip select command and an operation request are transmitted to a second memory chip, a multichip select command and an operation request are transmitted to a fourth memory chip, and a multichip select command and an operation request are transmitted to a first memory chip, and then an operation confirm signal is transmitted such that the second memory chip, the fourth memory chip and the first memory chip simultaneously perform cell operations. The number of memory chips to perform a multichip operation in the memory system 20 may be determined by the controller 500. Alternatively, the number may be determined by a host system outside the memory system.

Figure 8:
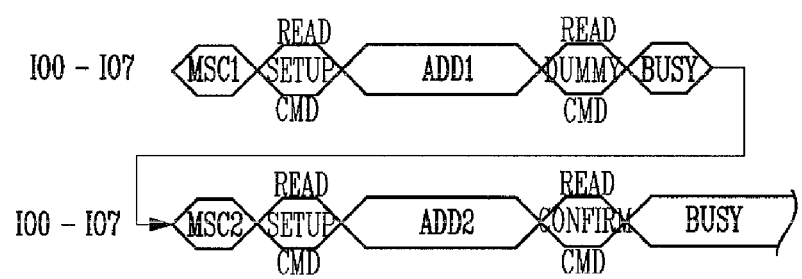
FIG. 8 is a timing chart showing a read operation method of the memory system according to an embodiment of the present disclosure.

FIG. 8 is a timing chart showing a read operation method of the memory system according to an embodiment of the present disclosure. FIGS. 2, 4 and 7 are charts for describing operation of a memory system in which a multichip operation is a program operation, and the description above has focused on the program operation. However, the present disclosure is not limited thereto, and the memory system according to an embodiment of the present disclosure and an operation method thereof are not limited to a program operation, but may be applied to a read operation and an erase operation.

Referring to FIG. 8, similar to FIG. 2, data is input to eight pins including IO0 to IO7. The eight pins including IO0 to IO7 may be connected to a data bus. A first multichip select command MSC1 and a read setup command READ SETUP CMD are transmitted through the data bus. Since the first multichip select command MSC1 involves an operation of the first memory chip 100, the first memory chip 100 may prepare for an operation by receiving the first multichip select command MSC1. Meanwhile, the second memory chip 200 may ignore the first multichip select command MSC1.

Thereafter, an address ADD1 of a cell of the first memory chip 100 in which read data is stored is transmitted. In this case, a first operation request may include the address ADD1 of a first memory cell.

Thereafter, a read dummy command READ DUMMY CMD is transmitted, and the first memory chip 100 enters a busy BUSY state.

After the first operation request including the address ADD1 is transmitted to the first memory chip 100, a second multichip select command MSC2 and a read setup command READ SETUP CMD are transmitted to the second memory chip 200. Since the second multichip select command MSC2 involves an operation of the second memory chip 200, the first memory chip 100 may ignore the second multichip select command MSC2. Meanwhile, the second memory chip 200 may prepare for an operation by receiving the second multichip select command MSC2.

After the second multichip select command MSC2 and the read setup command READ SETUP CMD are transmitted, an address ADD2 of a cell of the second memory chip 200 in which read data is stored is transmitted. In this manner, transmission of the operation requests to the first memory chip 100 and the second memory chip 200 is completed.

After the first operation request and the second operation request are transmitted to the first memory chip 100 and the second memory chip 200, the controller 500 may transmit an operation confirm signal READ CONFIRM CMD. In this case, the multichip operation is a read operation, and thus the operation confirm signal READ CONFIRM CMD is a read operation confirm signal. The first memory chip 100 and the second memory chip 200 may simultaneously perform actual read operations in response to the operation confirm signal READ CONFIRM SIGNAL. That is, the first memory chip 100 reads data stored in the address ADD1 in response to the operation confirm signal READ CONFIRM CMD, and the second memory chip 200 reads data stored in the address ADD2 in response to the operation confirm signal. According to the memory system 10 of an embodiment of the present disclosure, data stored in the addresses ADD1 and ADD2 of the first memory chip 100 and the second memory chip 200 is simultaneously read, so that the operation speed of the memory system 10 is improved. That is, according to the memory system 10 according to an embodiment of the present disclosure, the first operation request is received by the first memory chip 100, the second operation request is received by the second memory chip 200, and then the operation confirm signal is transmitted to the first memory chip 100 and the second memory chip 200, and thus the first memory chip 100 and the second memory chip 200 simultaneously perform actual operations, so that the operation speed of the memory system 10 is improved.

Figure 9:
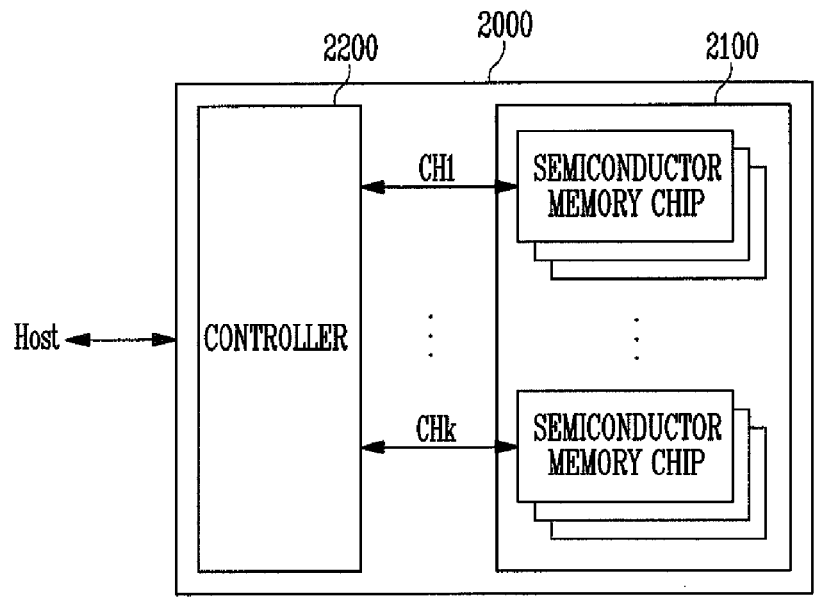
FIG. 9 is a block diagram illustrating an example of application of the memory system of FIG. 1.

FIG. 9 is a block diagram illustrating an example of an application 2000 of the memory system 10 of FIG. 1.

Referring to FIG. 9, the memory system 2000 includes a semiconductor memory device 2100 and a controller 2200. The semiconductor memory device 2100 includes a plurality of semiconductor memory chips. The memory system 2000 is configured and operates in the same manner as described with reference to FIGS. 1 to 8. The plurality of semiconductor memory chips are divided into a plurality of groups.

In FIG. 9, the plurality of groups are illustrated as communicating with the controller 2200 through a first channel to a $k^{th}$ channel CH1 to CHk (where k is a positive integer greater than 1). According to an embodiment, each of the first channel to the $k^{th}$ channel CH1 to CHk may include a data bus and an enable line ENL. The first memory chip and the second memory chip described with reference to FIG. 1 may communicate with the controller 2200 through one of the first channel to the $k^{th}$ channel CH1 to CHk.

Each of the groups is configured to communicate with the controller 2200 through a single common channel. The controller 2200 is configured in the same manner as the controller 500 described above with reference to FIG. 1, and controls the plurality of memory chips of the semiconductor memory device 2100 through the plurality of channels CH1 to CHk.

Although a plurality of semiconductor memory chips are illustrated as being connected to a single channel in FIG. 9, the number of memory chips connected to a single channel may be two or more as described in FIGS. 1 to 8. For example, two memory chips may be connected to a single channel as shown in FIG. 1, and four memory chips may be connected to a single channel as shown in FIG. 6. It will be understood that the number of memory chips connected to a single channel in common is not limited, and may vary within the scope to which aspects of the present disclosure are applied. Herein, detailed description identical to that of the previous description will be omitted.

The controller 2200 is connected to the host and the semiconductor memory device 2100. The controller 2200 is configured to access the semiconductor memory device 2100 in response to a request by the host. For example, the controller 2200 is configured to control a read operation, a write operation, an erase operation and a background operation of the semiconductor memory device 2100. The controller 2200 is configured to provide an interface between the semiconductor memory device 2100 and the host. The controller 2200 is configured to run firmware for controlling the semiconductor memory device 2100.

The controller 2200 includes a random access memory (RAM), a processing unit, a host interface, a memory interface and an error correction block. The RAM is used as at least one of an operating memory of the processing unit, a cache memory between the semiconductor memory device 2100 and the host, and a buffer memory between the semiconductor memory device 2100 and the host. The processing unit controls an overall operation of the controller 2200.

The host interface includes a protocol for performing data exchange between the host and the controller 2200. For example, the controller 2200 is configured to communicate with the host through at least one of a Universal Serial Bus (USB) protocol, a MultiMediaCard (MMC) protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface performs interfacing with the semiconductor memory device 2100. For example, the memory interface includes a NAND interface or a NOR interface.

The error correction block is configured to detect and correct an error of data received from the semiconductor memory device 2100 by use of an error correcting code (ECC).

The controller 2200 and the semiconductor memory device 2100 may be integrated into a single semiconductor device. According to an embodiment of the present disclosure, the controller 2200 and the semiconductor memory device 2100 may be integrated into a single semiconductor device to form a memory card, such as a Personal Computer Memory Card International Association (PCMCIA) card, a CompactFlash card (CF), a SmartMedia card (SM, SMC), a Memory Stick, an MMC (RS-MMC, MMCmicro), a Secure Digital card (SD, miniSD, microSD and SDHC), and a Universal Flash Storage device (UFS).

The controller 2200 and the semiconductor memory device 2100 may be integrated into a single semiconductor device to form a semiconductor drive, that is, a solid state drive (SSD). The semiconductor drive (SSD) includes a storage device configured to store data in a semiconductor memory. According to an example in which the memory system 2000 is used as the semiconductor drive (SSD), the operating speed of the host connected to the memory system 2000 may be remarkably improved.

According to an example, the memory system 2000 may be provided as one of various components of electronic devices, such as a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices forming a home network, one of various electronic devices forming a computer network, one of various electronic devices forming a telematics network, an RFID device, and one of various parts forming a computing system.

According to an embodiment of the present disclosure, the semiconductor memory device 2100 or the memory system 2000 may be mounted in various forms of packages. For example, the semiconductor memory device 2100 or the memory system 2000 may be packaged and mounted in various forms, such as a package on package (PoP), ball grid array (BGA), chip scale package (CSP), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline package (TSOP), system in package (SIP), multichip package (MCP), wafer-level fabricated package (WFP), and wafer-level processed stack package (WSP).

Figure 10:
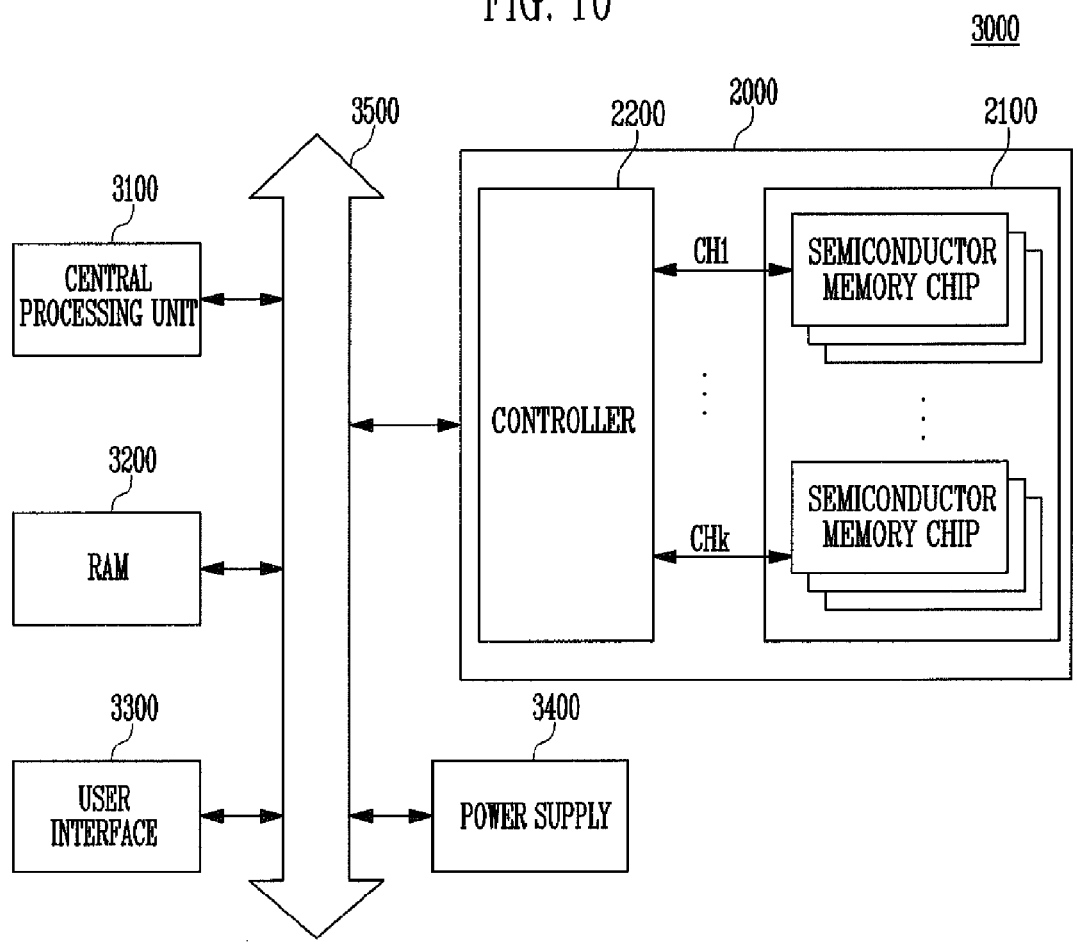
FIG. 10 is a block diagram illustrating a computing system including the memory system described with reference to FIG. 9.

FIG. 10 is a block diagram illustrating a computing system 3000 including the memory system 2000 described with reference to FIG. 9.

Referring to FIG. 10, the computing system 3000 includes a central processing unit (CPU) 3100, a random access memory (RAM) 3200, a user interface 3300, a power source 3400 (i.e., power supply), a system bus 3500 and the memory system 2000.

The memory system 2000 is electrically connected to the CPU 3100, the RAM 3200, the user interface 3300 and the power source 3400. Data provided through the user interface 3300 or processed by the CPU 3100 is stored in the memory system 2000.

Although the semiconductor memory device 2100 is illustrated in FIG. 10 as being connected to the system bus 3500 through the controller 2200, the semiconductor memory device 2100 may be configured to be directly connected to the system bus 3500. In this case, the function of the controller 2200 may be performed by the CPU 3100 and the RAM 3200.

In the drawings and specification, there have been disclosed various embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present disclosure as defined by the following claims.

What is claimed is:

1. A memory system comprising:
   a first memory chip configured to become active in response to a chip enable signal;
   a second memory chip configured to become active in response to the chip enable signal and configured to share a data bus with the first memory chip; and
   a controller connected to the first memory chip and the second memory chip in common through the data bus and configured to transmit a first multichip select command and a second multichip select command through the data bus,
   wherein the first memory chip, in response to the first multichip select command, receives a first operation request transmitted by the controller through the data bus; and
   wherein the second memory chip, in response to the second multichip select command, receives a second operation request transmitted by the controller through the data bus before the first memory chip operates according to the first operation request.

2. The memory system of claim 1, wherein the controller transmits an operation confirm signal to the first and second memory chips after transmitting the first and second operation requests.

3. The memory system of claim 2, wherein:
   the first memory chip performs an operation according to the first operation request in response to the operation confirm signal; and the second memory chip performs an operation according to the second operation request in response to the operation confirm signal.

4. The memory system of claim 3, wherein the first and second memory chips simultaneously perform the operations according to the first and second operation requests in response to the operation confirm signal.

5. The memory system of claim 1, wherein the first and second memory chips are connected by a single enable line.

6. The memory system of claim 5, wherein the first and second memory chips are simultaneously activated in response to the chip enable signal transmitted from the controller.

7. The memory system of claim 1, wherein:
the first memory chip includes a first plane and a second plane;
the second memory chip includes a third plane and a fourth plane;
the controller is connected to the first through fourth planes through the data bus and is configured to transmit a first multiplane select command and a third multiplane select command through the data bus,
the first plane, in response to the first multiplane select command, receives the first operation request transmitted by the controller through the data bus; and
the third plane, in response to a second multiplane select command, receives the second operation request transmitted by the controller through the data bus before the first plane operates according to the first operation request.

8. The memory system of claim 1, further comprising:
a third memory chip configured to become active in response to the chip enable signal and configured to share the data bus with the first memory chip; and
a fourth memory chip configured to become active in response to the chip enable signal and configured to share the data bus with the first memory chip,
wherein the controller is connected to the third memory chip and the fourth memory chip in common through the data bus and transmits a third multichip select command and a fourth multichip select command through the data bus;
wherein the third memory chip, in response to the third multichip select command, receives a third operation request transmitted by the controller through the data bus before the first and second memory chips perform operations according to the first and second operation requests; and
wherein the fourth memory chip, in response to the fourth multichip select command, receives a fourth operation request transmitted by the controller through the data bus before the first to third memory chips perform operations according to the first to third operation requests.

9. The memory system of claim 8, wherein the controller transmits an operation confirm signal to the first and fourth memory chips after transmitting the first and fourth operation requests.

10. The memory system of claim 9, wherein the first to fourth memory chips perform operations according to the first to fourth operation requests in response to the operation confirm signal.

11. The memory system of claim 10, wherein the first to fourth memory chip simultaneously perform the operations according to the first to fourth operation requests in response to the operation confirm signal.

12. The memory system of claim 1, wherein the first operation request and the second operation request represent a data program request.

13. The memory system of claim 12, wherein the first operation request and the second operation request comprise an operation command, an address and data.

14. The memory system of claim 1, wherein the first operation request and the second operation request comprise one of a data read request and a data erase request.

15. The memory system of claim 14, wherein the first operation request and the second operation request comprise an operation command and an address.

16. A method of operating a memory system having a plurality of memory chips including a first memory chip and a second memory chip and a controller, the method comprising:
allowing the plurality of memory chips to become active by transmitting a chip enable signal;
transmitting a first multichip select command to the first memory chip from the controller;
transmitting a first operation request to the first memory chip in response to the first multichip select command;
transmitting a second multichip select command to the second memory chip from the controller;
transmitting a second operation request to the second memory chip in response to the second multichip select command;
transmitting an operation confirm signal to the first and second memory chips from the controller; and
performing operations according to the first and second operation requests in response to the operation confirm signal.

17. The method of claim 16, wherein each of the first and second operation requests comprises one of a program request, a data read request and a data erase request.

18. The method of claim 16, wherein the operations according to the first and second operation requests are performed simultaneously in response to the operation confirm signal.

19. A method of operating a semiconductor memory device, the method comprising:
receiving a multichip select command;
receiving an operation request in response to the multichip select command;
receiving an operation confirm signal instructing to perform an operation according to the operation request; and
performing the operation according to the operation request in response to the operation confirm signal.

* * * * *